United States Patent [19]

Dickson

[11] Patent Number: 5,694,088

[45] Date of Patent: Dec. 2, 1997

[54] PHASE LOCKED LOOP WITH IMPROVED PHASE-FREQUENCY DETECTION

[75] Inventor: Andrew H. Dickson, Beaverton, Oreg.

[73] Assignee: Maxim Integrated Products, Inc., Sunnyvale, Calif.

[21] Appl. No.: 679,426

[22] Filed: Jul. 8, 1996

[51] Int. Cl.⁶ .............. H03L 7/087; H03L 7/093; H03K 5/26; H03H 11/04
[52] U.S. Cl. .............. 331/12; 331/1 A; 331/8; 331/17; 331/23; 331/25; 327/43; 327/553; 327/558; 375/376
[58] Field of Search .............. 331/1 A, 8, 11, 331/12, 14, 17, 23, 25, DIG. 2; 327/40–43, 552, 553, 558; 333/172, 174; 360/41, 51; 375/376

[56] References Cited

U.S. PATENT DOCUMENTS

| | | | |
|---|---|---|---|
| 4,338,574 | 7/1982 | Fujita et al. | 331/1 A |
| 4,409,563 | 10/1983 | Vandegraaf | 331/11 |
| 4,568,888 | 2/1986 | Kimura et al. | 331/10 |
| 5,399,995 | 3/1995 | Kardontchik et al. | 331/17 |
| 5,432,827 | 7/1995 | Mader | 375/376 |
| 5,512,860 | 4/1996 | Huscroft et al. | 331/1 A |

OTHER PUBLICATIONS

Pottbäcker, Ansgar et al., "A Si Bipolar Phase and Frequency Detector IC for Clock Extraction Up to 8 Gb/s," IEEE 1992, pp. 1747–1751, IEEE Journal of Solid–State Circuits, vol. 27, No. 12, Dec. 1992.

*Primary Examiner*—David Mis
*Attorney, Agent, or Firm*—Hickman Beyer & Weaver

[57] ABSTRACT

A phase locked loop including an in-phase detector (IPD), a quadrature phase detector (QPD), a frequency detector (FD), a squelch, a filter, and a voltage controlled oscillator (VCO). The in-phase detector has an IPD sample input, an IPD input, and an IPD output, where the IPD sample input is coupled to a data input. The quadrature phase detector has a QPD sample input, a QPD input, and a QPD output, where the QPD sample input is coupled to the data input. The frequency detector has a first FD input coupled to the IPD output, a second FD input coupled to the QPD output, and a FD output. The squelch has a squelch input, an enable input, and a squelch output where the squelch input is coupled to the IPD output and the squelch enable is coupled to the FD output. The filter has a filter input coupled to the squelch output and a filter output. The voltage controlled oscillator has a VCO input coupled to the filter output, a VCO in-phase output, and a VCO quadrature output. The VCO in-phase output is coupled to the IPD input and the VCO quadrature output is coupled to the QPD input. The PLL has an improved pull-in range with reduced chance of out-of-phase lock.

20 Claims, 10 Drawing Sheets

LOGIC TABLE OF FREQUENCY DETECTOR 16

| IPD | QPD | FD |
|---|---|---|
| RISING | 1 | 0 |
| FALLING | 1 | 0 |
| RISING | -1 | -1 |
| FALLING | -1 | 1 |

*Fig. 1b*
PRIOR ART

LOGIC TABLE OF FREQUENCY DETECTOR AND SQUELCH

| IPD | QPD | FD | SQUELCH |
|---|---|---|---|
| RISING | 1 | 0 | TRANSPARENT |
| FALLING | 1 | 0 | TRANSPARENT |
| RISING | -1 | 1 | SQUELCHED |
| FALLING | -1 | 1 | SQUELCHED |

PHASE LOCKED LOOP WITH IMPROVED PHASE-FREQUENCY DETECTION

TECHNICAL FIELD

This invention relates generally to electronic circuitry, and more particularly to phase locked loops.

BACKGROUND ART

A phase locked loop (PLL) is a system that uses feedback to maintain an output signal in a specific phase relationship with a reference signal. PLLs are used in many areas of electronics to control the frequency and/or phase of a signal. These applications include frequency synthesizers, analog and digital modulators and demodulators, and clock recovery circuits.

A typical prior art PLL includes a phase detector, a loop filter, and a voltage controlled oscillator (VCO). The phase detector produces an output voltage that is proportional to the phase difference of an input signal and the output of the VCO. The loop filter integrates the output of the phase detector and creates a VCO control signal. The VCO produces an a.c. output signal having a frequency that is proportional to the VCO control voltage.

With conventional phase locked loops, difficulties are presented when attempting to phase lock to high frequency input signals. For example, the synchronous optical network (SONET) standard specifies that a 622 megahertz PLL should have a loop bandwidth of between 250 and 500 kilohertz. Unfortunately, a standard PLL can only "pull-in" an input signal that is within about a loop bandwidth of the nominal frequency. In the above example, this means that a SONET standard PLL has a "pull-in" range of about ±0.04% to about ±0.08%. Therefore, at these high frequencies, typically some form of frequency aid is required to get a wider pull-in range.

In an article entitled "A Si Bipolar Phase and Frequency Detector IC for Clock Extraction Up to 8 Gb/s", Pottbacker et al., IEEE, 1992, a phase and frequency detector is disclosed that operates up to a "Non-Return to Zero" or "NRZ" bit rate of 8 Gb/s, the disclosure of which is incorporated herein by reference. A phase and frequency detector integrated circuit (IC) in accordance with Pottbacker et al. design includes an in-phase detector (IPD), a quadrature phase detector (QPD), and a frequency detector (FD). In the IPD and QPD, the VCO signal and the quadrature VCO signal are sampled by the NRZ input signal. The two "beat notes" provided by this operation are subsequently processed in the FD. The superposition of the FD output and the IPD output signals are then fed into a passive loop filter to provide a pull-in range greater than ±100 megahertz at 8 Gb/s.

Figure 1:
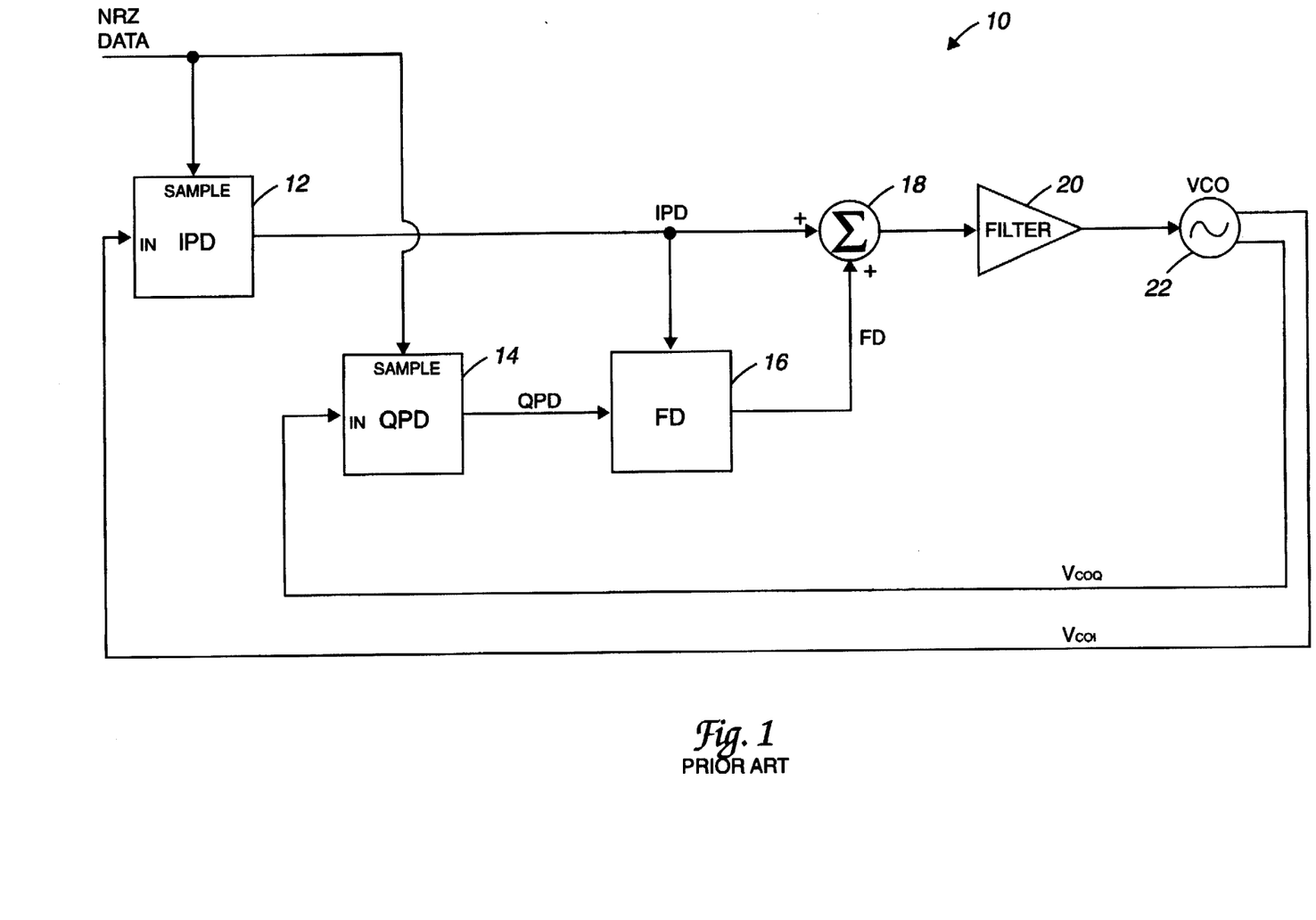
FIG. 1 is a block diagram of a phase locked loop with frequency detector in accordance with the prior art.

With reference to FIG. 1, a prior art PLL 10 built with the Pottbacker et al. design includes an in-phase detector (IPD) 12, a quadrature phase detector (QPD) 14, a frequency detector (FD) 16, a summer 18, a filter 20, and a VCO 22. The NRZ input data is coupled to the sample inputs of the IPD 12 and the QPD 14. The outputs of the IPD 12 and the QPD 14 are input into FD 16 to create an FD output that is summed with the IPD output of IPD 12 in summer 18. The output of the summer 18 is integrated within filter 20 to provide an output that controls the frequency of the VCO 22. The VCO 22 produces a pair of outputs $V_{COQ}$ and $V_{COI}$ which are connected to the inputs of QPD 14 and IPD 12, respectively.

Figure 1A:
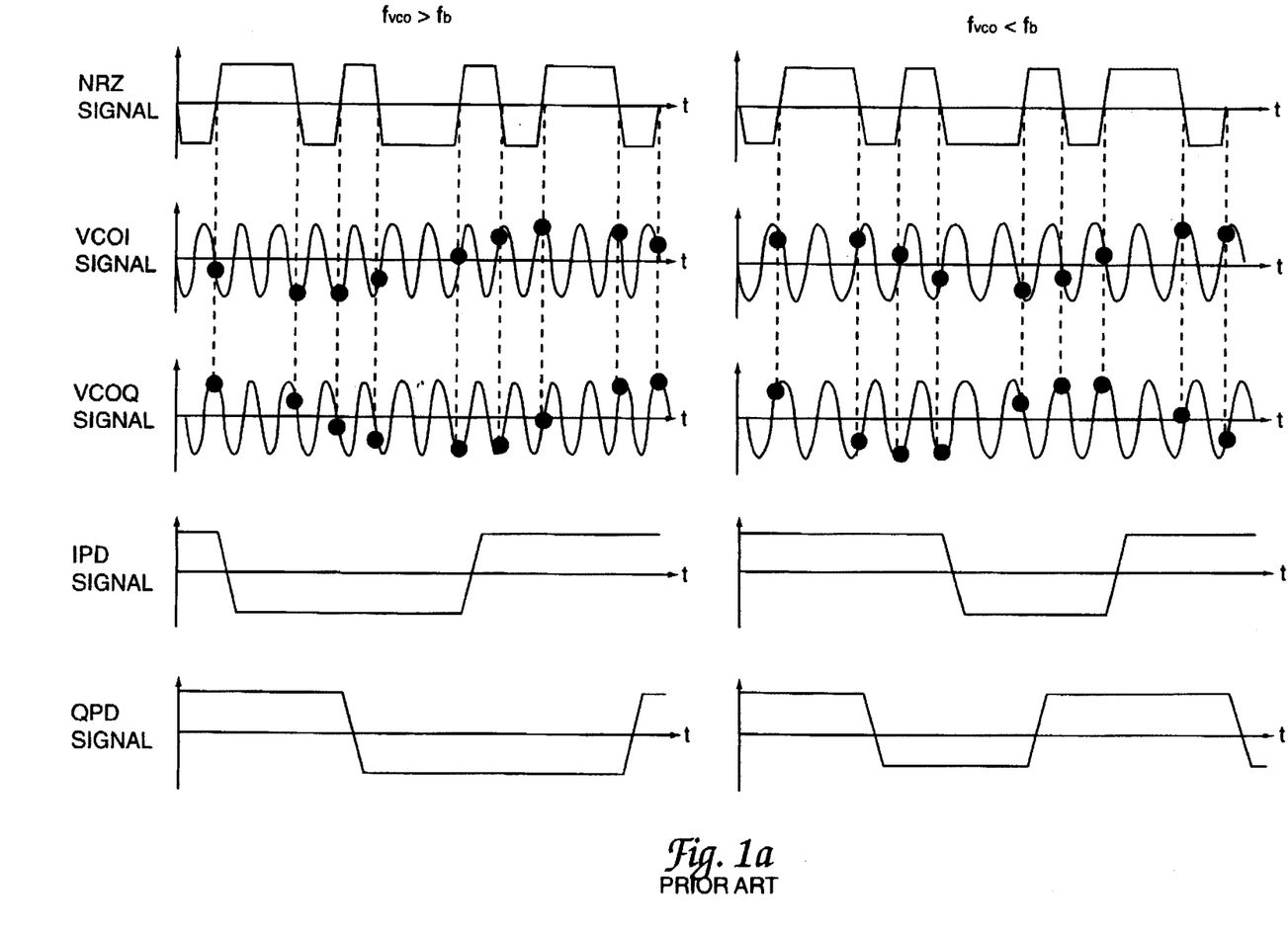
FIGS. 1a, 1b, and 1c are used to illustrate the operation of the PLL of FIG. 1.

The operation of the PLL 10 of FIG. 1 will be explained with reference to FIGS. 1a–1c. In FIG. 1a, the relationships between the NRZ signal, the VCO signal, the VCO signal delay, the IPD signal, and the QPD signal are illustrated for the case where $F_{VCO}>F_B$ and for the case where $F_{VCO}<F_B$. In this nomenclature, $F_{VCO}$ is the frequency of the VCO, and $F_B$ is the bit frequency. The NRZ signal is used to sample the $V_{COI}$ signal and the $V_{COQ}$ signal developed by the VCO 22. This causes an "aliasing" of the signals to create "beat-notes", i.e. the IPD and QPD signals. The QPD signal is 90° out-of-phase with the IPD signal, i.e., it is "in quadrature" with the IPD signal.

Figure 1B:
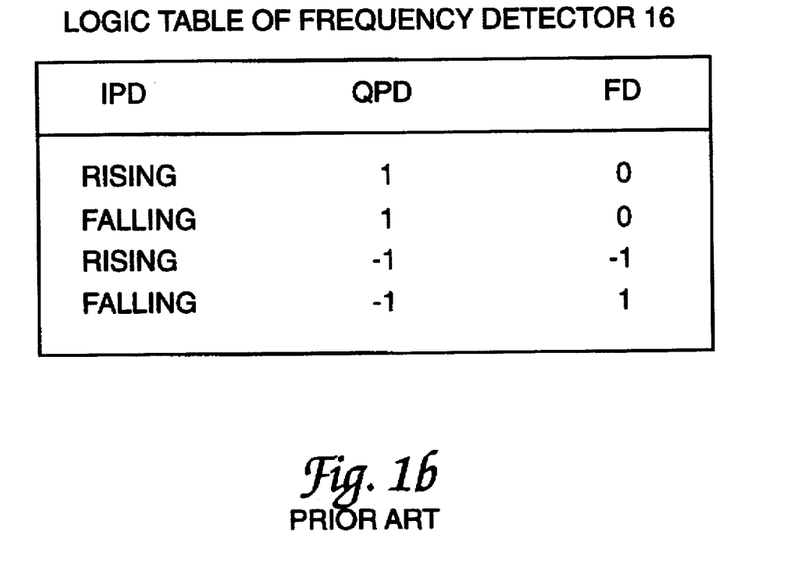

The operation of the frequency detector 16 is summarized in the chart of FIG. 1b. The state of the FD only changes on a rising or falling edge of IPD. If an edge of IPD occurs when QPD is 1, the FD signal is 0. In that instance, the output of the summer 18 is equal to the IPD signal input and the PLL is in phase lock. If an edge of IPD occurs when QPD is −1, the FD output signal moves in the opposite direction to IPD, i.e. a positive transition forces FD to −1, and a negative transition forces FD to +1. In this instance, the operation of the frequency detector is to detect when a "cycle slip" occurs.

Figure 1C:
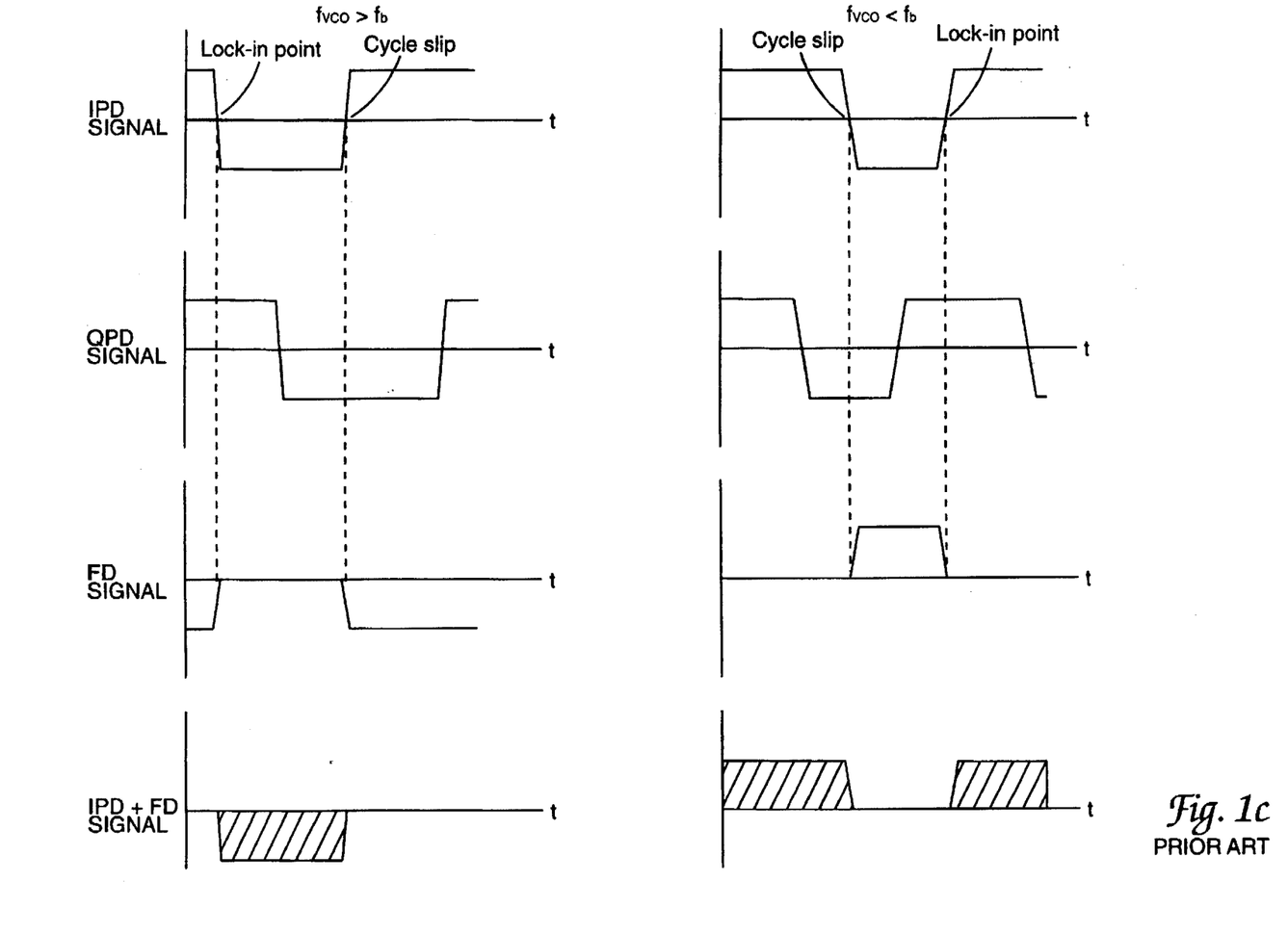
Figure 2:
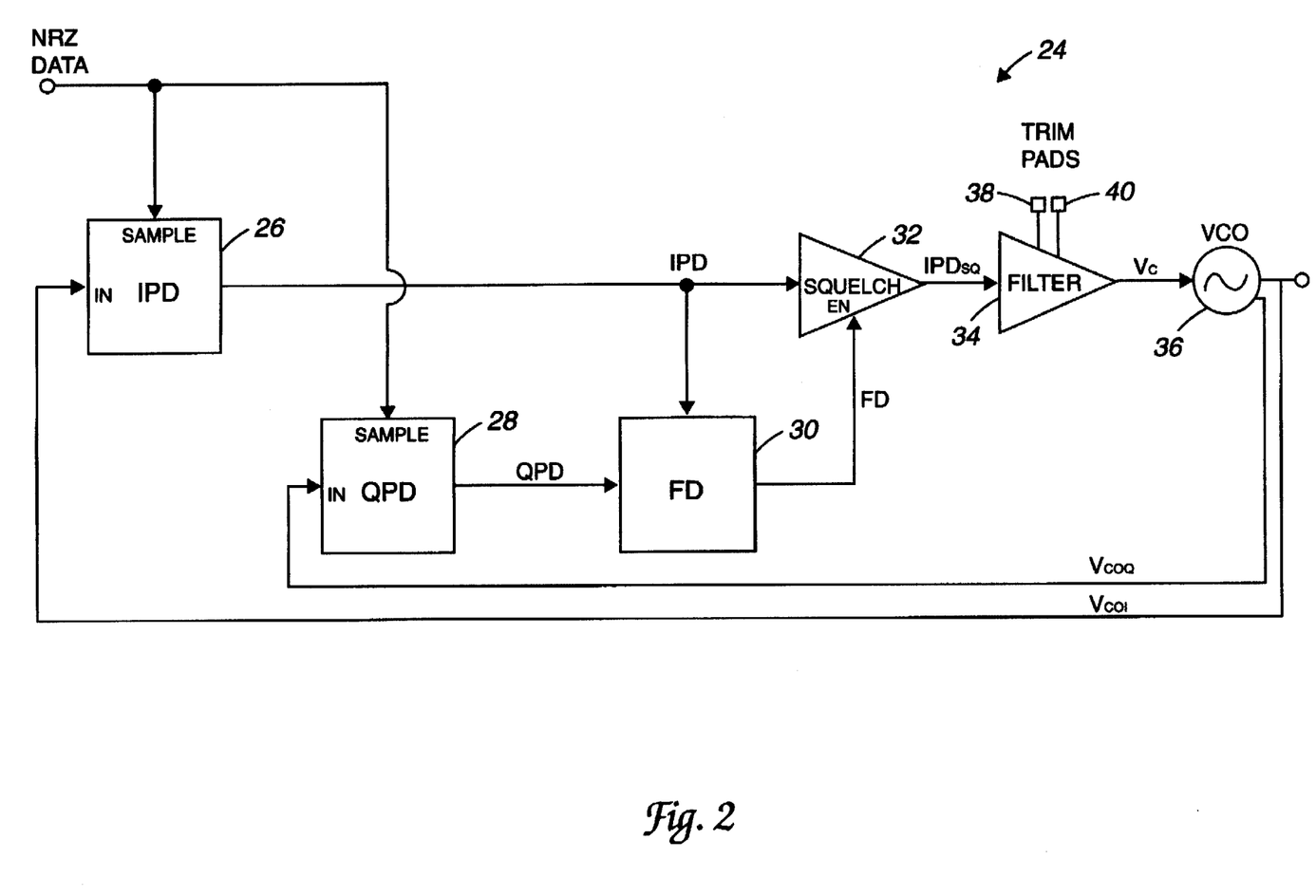
FIG. 2 is a block diagram of a phase locked loop (PLL) of the present invention.

In FIG. 1c, the relationships between the IPD signal, the QPD signal, the FD signal, and the IPD+FD signal are shown. Again, these relationships are shown for instances where $F_{VCO}>F_B$, and for instances where $F_{VCO}<F_B$. When $F_{VCO}>F_B$, a transition of the IPD signal will activate the FD signal in such a way as to cancel the positive half cycles of the IPD signal at the output signal from summer 18. The resulting waveform at the output of the summer is simply the negative half-cycle of IPD which, when integrated by the filter, will drive down the VCO frequency and bring the loop into lock. When $F_{VCO}<F_B$, the output of the summer 18 will include only the positive half cycles of the IPD signal which, when integrated by the filter, will drive up the VCO frequency and bring the loop into lock. Therefore, the VCO will be driven in the appropriate direction to bring the PLL 10 into phase lock.

While the phase lock loop and frequency detector of Portbacker et al. are admirable improvements in the art, they do suffer from several drawbacks. In particular, with Pottbacker et al., the FD signal and the IPD signal must be precisely in-phase and be of exactly equal but opposite amplitude in order to provide the desired cancellation. In many cases, the operation of the frequency detector 16 is relatively slow compared to the phase detectors 12 and 14, and the Portbacker et al. circuit may fail to properly cancel the IPD signal within the summer 18, leading to a 180° out-of-phase locking of the PLL to the NRZ data. In such a case, the NRZ data will be lost.

In addition, the Pottbacker et al. paper does not disclosed a method for ensuring that the loop bandwidth is not out of range due, for example, to process variations. As a result, the gain and center frequency of a Pottbacker et al. PLL can drift and/or otherwise be less than desirable.

DISCLOSURE OF THE INVENTION

The present invention utilizes a frequency detector to extend the pull-in range of a phase locked loop (PLL). However, unlike the prior art, the frequency detector of the present invention has been redesigned for use with a squelch rather than a summer to virtually eliminate the chance of inadvertently locking to the wrong phase of an input signal. In addition, a trimmable filter and method are provided to optimize the center-frequency, gain, and offset of the filter, thereby allowing the PLL to operate in applications which require fight loop bandwidth specifications.

A phase locked loop in accordance with the present invention includes an in-phase detector (IPD), a quadrature phase detector (QPD), a frequency detector (FD), a squelch, a filter, and a voltage controlled oscillator (VCO). The in-phase detector has an IPD sample input, an IPD input, and an IPD output, where the IPD sample input is coupled to a data input. The quadrature phase detector has a QPD sample input, a QPD input, and a QPD output, where the QPD sample input is coupled to the data input. The frequency detector has a first FD input coupled to the IPD output, a second FD input coupled to the QPD output, and a FD output. The squelch has a squelch input, an enable input, and a squelch output where the squelch input is coupled to the IPD output and the squelch enable is coupled to the FD output. The filter has a filter input coupled to the squelch output and a filter output. The voltage controller oscillator has a VCO input coupled to the filter output, a VCO in-phase output, and a VCO quadrature output. The VCO in-phase output is coupled to the IPD input and the VCO quadrature output is coupled to the QPD input.

In operation, the in-phase detector and the quadrature phase detector perform an "aliasing" function wherein the data input is used to sample the VCO outputs to create IPD signal beat notes and QPD signal beat notes. These beat notes are compared within the frequency detector which creates a control signal on the FD output to control the squelch. When there is a beat note present in the IPD and QPD signals, the frequency detector can provide an appropriate squelching signal to partially squelch the appropriate half cycles of the IPD signal. This squelch signal is integrated within the filter and is used to "nudge" the VCO in the proper direction to bring the PLL back into phase lock.

A major advantage of the present invention is that a phase locked loop is provided that can operate at high frequencies with a low loop bandwidth and which is relatively immune from locking to the wrong phase of the input signal. Furthermore, the present invention provides an trimmable filter which allows precise control of PLL loop bandwidth and center frequency.

These and other advantages of the present invention will become apparent upon reading the following detailed descriptions and studying the various figures of the drawings.

BEST MODES FOR CARRYING OUT THE INVENTION

FIGS. 1 and 1a–1c were described previously with reference to the prior art. A phase locked loop (PLL) 24 in accordance with the present invention includes an in-phase detector (IPD) 26, a quadrature phase detector (QPD) 28, a frequency detector (FD) 30, a squelch 32, a filter 34, and a voltage controller oscillator (VCO) 36. The IPD 26 and QPD 28 each have a sample input connected to a data input ("NRZ data"). Again, "NRZ" is an abbreviation for "Non-Return to Zero." The IPD 26 also has an input coupled to a $V_{COI}$ output of VCO 36, and the QPD 28 has an input coupled to the $V_{COQ}$ output of VCO 36. The IPD 26 outputs an IPD signal which is input to frequency detector 30 and to the squelch 32. The QPD 28 has a QPD signal output which is input to frequency detector 30. The frequency detector 30 has a frequency detector signal output as coupled to the enable input of squelch 32. The squelch 32 has an $IPD_{SQ}$ signal output which is input to filter 34. The filter 34 is provided with a pair of external filter pads 38 and 40 which allows for the trimming of the filter using an external resistor. The filter has an output $V_C$ which controls the VCO 36. The VCO 36 produces a $V_{COI}$ output and a $V_{COQ}$ output having a frequency dependent upon the control voltage $V_C$. The frequency of $V_{COI}$ is 90° out of phase with the frequency of signal $V_{COQ}$, i.e., $V_{COQ}$ is in quadrature with the $V_{COI}$ signal. As noted previously, the $V_{COQ}$ signal is input into QPD 28, while the $V_{COI}$ signal is input into IPD 26. This connection forms the feedback which permits the PLL 24 to phase lock. The signal $V_{COI}$ is normally used as the output from the PLL 24.

The operation of the PLL 24 will be described with reference to FIGS. 1a, 3a, and 3b. The sampling of the $V_{COI}$ and $V_{COQ}$ signals with the NRZ input data signal to create the "beat" signals IPD and QPD and operate as an in the prior art as illustrated in FIG. 1a. However, as will be described in greater detail subsequently, the operation of the frequency detector 30 of the PLL 24 of the present invention operate substantially differently from the frequency detector of the prior art.

Figure 3A:
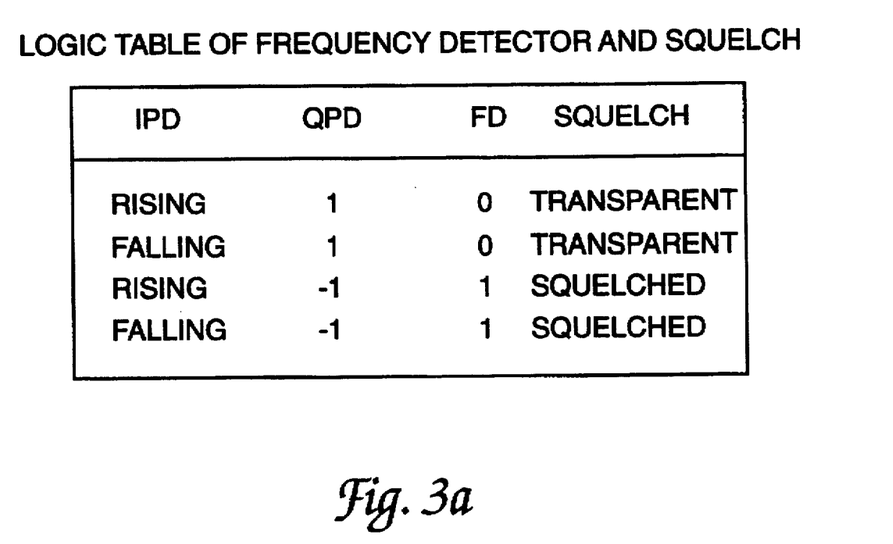
FIG. 3a is a logic table used to illustrate the operation of the PLL of FIG. 2.

As noted in the logic table of FIG. 3a, in the present invention, when IPD is rising and QPD is 1, the signal FD is 0 and the squelch is "transparent." When IPD is falling and QPD is 1, FD is 0 and the squelch is also transparent. When IPD is rising and QPD is −1, FD is 1 and the squelch is active, i.e. the signal is "squelched." When IPD is falling and QPD is −1, FD is again 1 and the signal is again squelched.

Figure 3B:
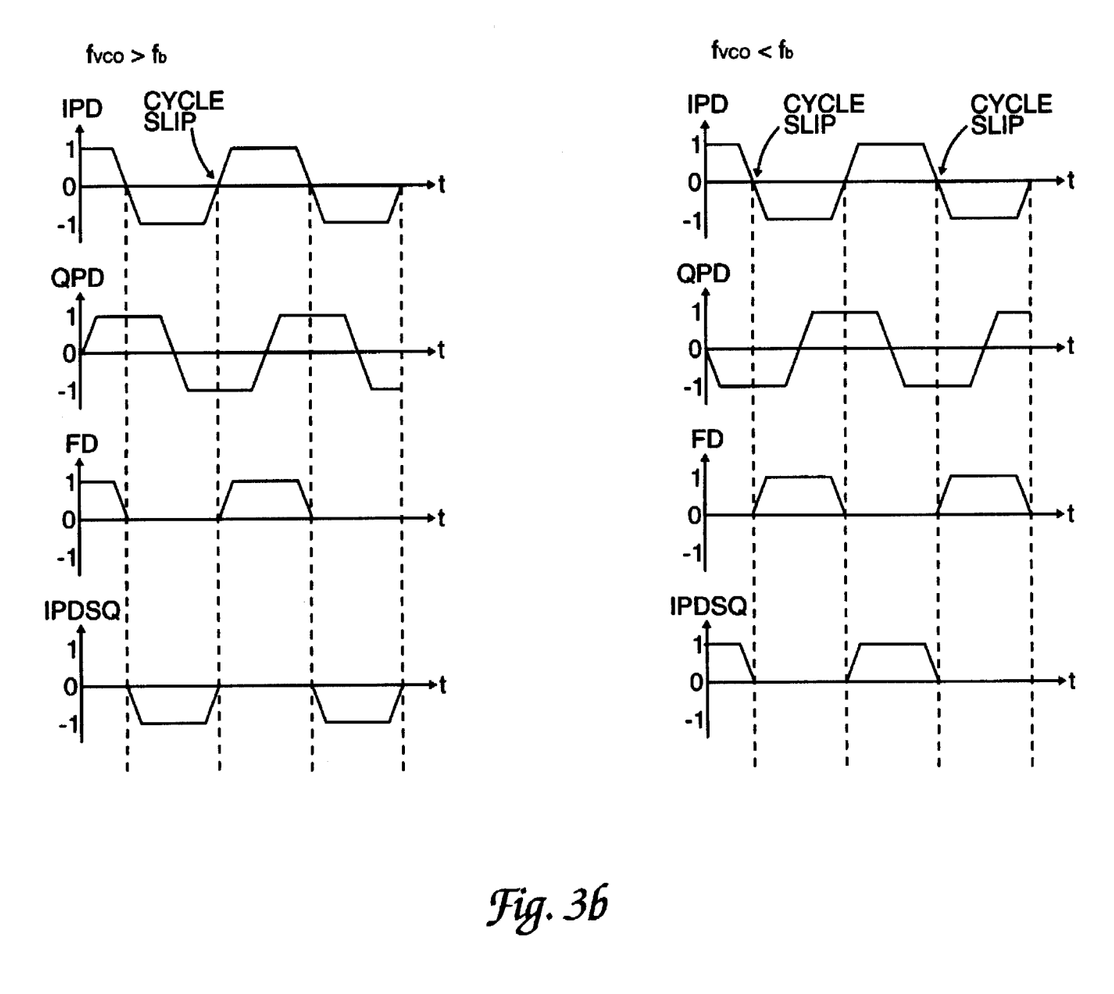
FIG. 3b are timing diagrams used to further illustrate the operation of PLL of FIG. 2.

With additional reference to FIG. 3b, a pair of timing diagrams are shown illustrating the relationships of the IPD, QPD, FD, and $IPD_{SQ}$ signals for the instances when the frequency $F_{VCO} > F_B$ and when $F_{VCO} < F_B$. As in the previously discussed Pottbacker et al. frequency detector, the disclosure of which has been incorporated by reference, the FD output can only change state on a rising or falling edge of the IPD signal. However, in the present invention the FD output turns on (high) and "squelches" the IPD signal whenever there is a transition of IPD when QPD is −1, regardless of the polarity of the transition. By "squelch", it is meant herein that the signal is at least substantially attenuated, if not eliminated, by the squelching process. This has the effect of detecting when a "cycle slip" has occurred. If QPD is +1 when a transition of IPD occurs, the FD output turns off (low) and the IPD signal is transparent through the squelch and is presented to the filter. By "transparent" it is meant herein that the signal is not attenuated to any significant degree by the squelch circuit, i.e. the squelch operates essentially as a 1:1 buffer when it is in the transparent mode, although some attenuation or amplification is also acceptable.

Therefore, unlike the Pottbacker et al. PLL, there is no requirement that the IPD and FD signals closely match to provide the desired cancellation. The present invention eliminates that constraint by squelching the IPD signal, which virtually eliminates the possibility of locking to the wrong phase and thereby loosing the input data.

Figure 4:
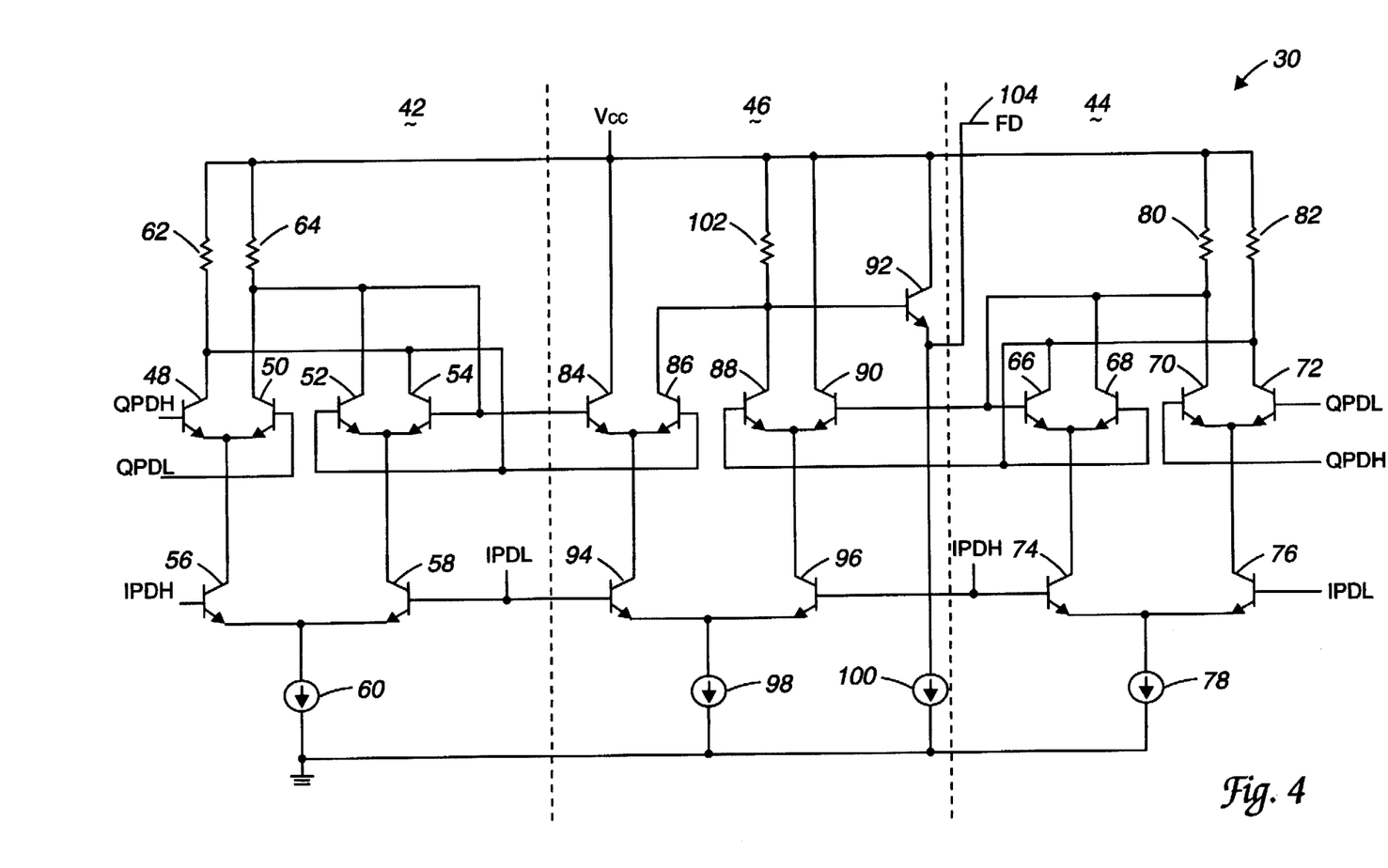
FIG. 4 is a schematic of a frequency detector in accordance with the present invention.

In FIG. 4, a preferred frequency detector (FD) 30 in accordance with the present invention will be discussed. The frequency detector 30 includes a first latch 42, a second latch 44, and a multiplexer 46. It should be noted that while the Pottbacker et al. frequency detector also has a pair of latches and a multiplexer, the Pottbacker et al. multiplexer, in particular, is of a substantially different design. More particularly, the Pottbacker et al. multiplexer is a tri-state output (−1, 0, 1) design that is designed to be input to a summer of the prior art, while the present multiplexer is a dual-state output (0,1) design designed to be input into a squelch of the present invention.

In the present invention, the first latch 42 includes a number of NPN bipolar transistors 48, 50, 52, 54, 56, and 58, a current source 60, and a pair of resistors 62 and 64. The second latch 44 is of the same construction as the first latch 42 includes and includes NPN bipolar transistors 66, 68, 70, 72, 74, and 76, a current source 78, and a pair of resistors 80 and 82. The multiplexer (MUX) 46 includes NPN bipolar transistors 84, 86, 88, 90, 92, 94, and 96, current sources 98 and 100, and resistor 102.

As will be appreciated by those skilled in the art, the signals IPD and QPD are differential, and include a high side ("positive") and a low side ("negative"). The differential signals for IPD will be designated $IPD_H$ for the high side, and $IPD_L$ for the low side. The differential signals for QPD will be designated $QPD_H$ for the high side, and $QPD_L$ for the low side.

The base of transistor 48 is coupled to the signal $QPD_H$ and the base of transistor 50 is coupled to the signal $QPD_L$. The base of transistor 56 is coupled to $IPD_H$ and the bases of transistors 58 and 94 are coupled to signal $IPD_L$. The base of transistor 72 is coupled to the signal $QPD_L$, while the base of transistor 70 is coupled to the signal $QPD_H$. The base of transistor 76 is coupled to $IPD_L$, while the bases of transistors 96 and 74 are coupled to the signal $IPD_H$. The output of the frequency detector 30, i.e., the signal FD, is found on line 104.

The latches 42 and 44 are simple digital latches. The output stage of the frequency detector 30 is the middle stage, i.e., the MUX 46. The latches 42 and 44 are edge triggered. The signal IPD triggers the latch to store the state of QPD.

Since the latching signal polarities are reversed between latches 42 and 44, one of the latches will always be "latched," while the other of the latches will be "transparent." By "latched" it is meant that the state on the output of the latch remains constant regardless of the input to the latch. By "transparent" it is meant that the output of the latch follows the input of the latch, i.e. it is as if the latch were not them. As will be explained subsequently, the MUX 46 will look at the output of the latched latch, while ignoring the output of the transparent latch.

The operation of the MUX 46 will be described by way of example. If, in this example, $IPD_L$ is high, then transistors 58 and 94 are turned on. Since $IPD_L$, in this example, is high, $IPD_H$ will be low, turning off transistors 96, 56 and 74. Therefore, in this example, the latch 44 is "transparent" and is ignored by the MUX 46. The latch 42 is in a latched state, and the MUX 46 will look at the output signal of the latch 42. When the signal $IPD_L$ goes low and $IPD_H$ goes high, the latch 42 becomes transparent and will be ignored by the MUX 46 and the latch 44 will be latched.

The MUX 46 pulls current through the resistor 102. A rising edge on IPD latches the value of QPD in latch 44. At the same time, MUX 46 selects the latch 44 outputs. If the latched QPD is high, FD drops low. If the latched QPD is low, FD goes high. Similarly, a falling edge on IPD latches the value of QPD in latch 42. At the same time, the MUX 46 selects the latch 42 outputs. If the latched QPD is high, FD drops low, and if the latched QPD is low, FD goes high. This logic is illustrated in FIG. 3a.

Figure 5:
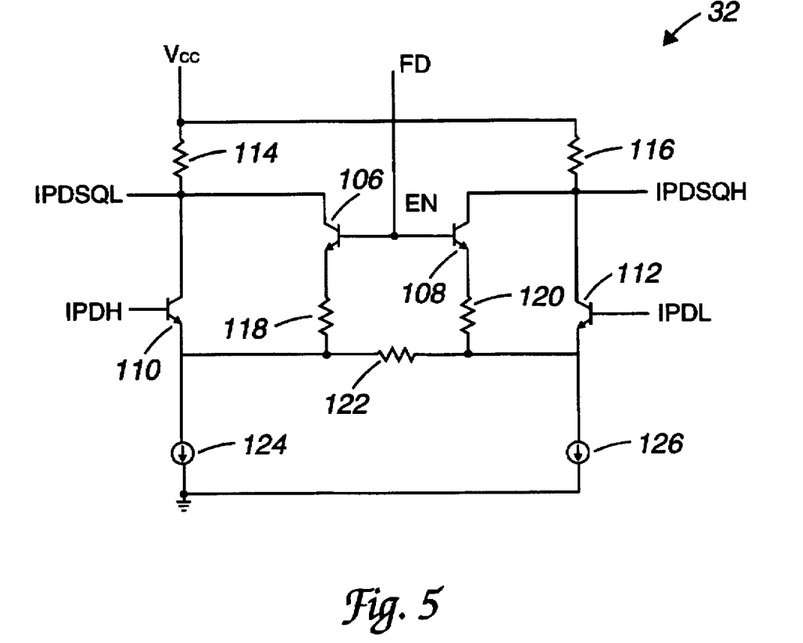
FIG. 5 is a schematic of a squelch in accordance with the present invention.

With reference to FIG. 5, the squelch 32 will be discussed in greater detail. The squelch includes NPN bipolar transistors 106, 108, 110, and 112, resistors 114, 116, 118, 120, and 122, and a pair of current sources 124 and 126. The signal $IPD_H$ is applied to the base of transistor 110, and the signal $IPD_L$ is coupled to the base of transistor 112. The squelch enable input is applied to the bases of transistors 106 and 108. The output is taken across the IPDSQH and IPDSQL nodes.

In normal operation of the PLL 24, i.e. when it is in phase lock, the squelch input signal FD is 0 (low). This turns off transistors 106 and 108, reverse biasing their base-emitter junction. In that state, transistors 110 and 112 become a simple differential amplifier and the squelch becomes transparent, i.e., it operates as a 1:1 buffer where the output signal is essentially a duplicate of the input signal. When the FD signal is 1 (high), the transistors 106 and 108 are turned on, stealing current from transistors 110 and 112, thereby squelching the output.

The resistors 118 and 120 limit the current that can be taken from transistors 110 and 112 by the transistors 106 and 108, respectively, setting the attenuation level of the squelch, i.e. setting the "squelch attenuation." For example, to provide an approximately 75% squelch, i.e., to provide an output signal that is approximately 25% the value of the input signal, the values of resistors 118 and 120 should be approximately one half of the value of resistor 122. However, it should be noted that this is very approximate, since the amount of squelch is also highly dependent upon the range of the enable input to the squelch. Nonetheless, the aforementioned "role of thumb" for the relationships between the resistors 119, 120, and 122 has been found to produce the desired results.

The squelch circuit 32 can produce a 100% squelch by shorting the resistors 118 and 120 with low resistance conductors. However, it may be preferable to have less than 100% squelching with the squelch circuit 32. This is because a full, 100% squelch would mean that no signal is being applied to the filter 34. In such an instance, even if the PLL 24 was frequency and phase locked, large jitter transients could substantially affect the bit error ratio ("BER") by knocking the frequency detector and squelch circuit into the squelched mode. If that occurred, it may require a relatively long time period to reacquire the phase locking since there would be no signal present at the filter input to drive the PLL back into lock.

By only partially squelching the IPD signal, some IPD signal remains that allows the filter 34 to create a signal to urge the PLL 24 back into phase lock, avoiding the aforementioned problem. It therefore may be desirable to have the squelch level somewhere in the range of 50% <squelch<100%, e.g. a squelch of about 75%. To ensure that the aforementioned problem will not occur.

Figure 6:
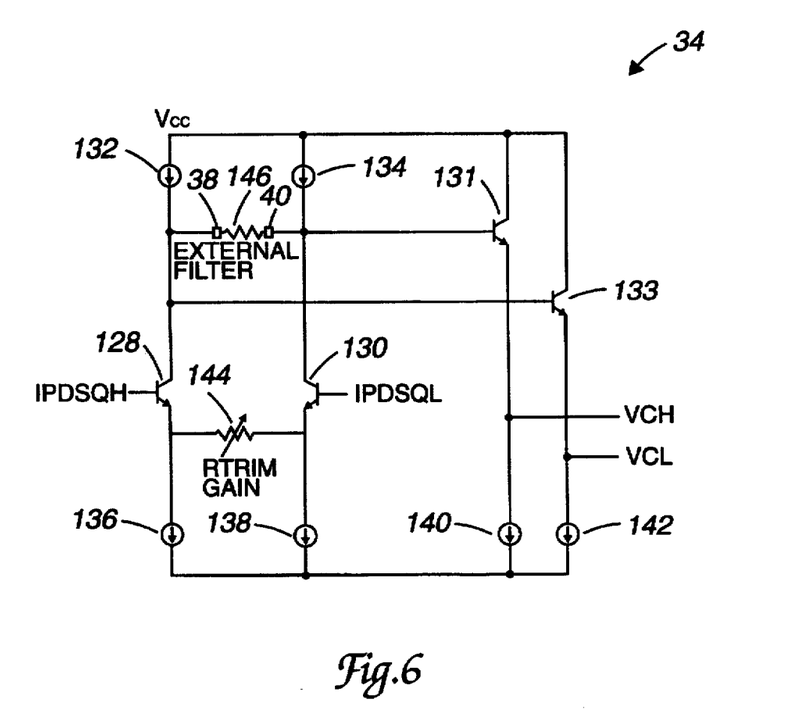
FIG. 6 is a schematic of a filter in accordance with the present invention.

With reference to FIG. 6, the filter 34 includes transistors 128, 130, 131, and 133, current sources 132, 134, 136, 138, 140, and 142, a variable trim resistor 144, pads 38 and 40, and an external resistor 146. The current sources 132–138 are matched current sources to balance the current flow in the left-hand side of the circuit of filter 34. The right-hand side of the circuit comprising transistors 131 and 133, and current sources 140 and 142 are set up as emitter follower transistors, where the current sources 140 and 142 provide the biasing current. Current sources 140 and 142 do not need to be matched. The gain of the left-hand circuit is given as the ratio of the resistance of the external filter resistor 146 to the trim resistor 144.

It should be noted that the transistors 128–134, the current sources 132–142, and the variable trim resistor 144 are preferably formed as part of an integrated circuit (IC), i.e., are formed in, on, or over a semiconductor substrate. The external filter or resistor 146 is not formed in, on, or over the semiconductor substrate, i.e. it is an external, discrete component that can be varied as desired by the end user.

It should also be noted that during normal operation, the external filter coupled to the pads includes a capacitor in series with a resistor. This provides the integration function of the filter, along with an "a.c" gain of $K_h$, where $K_h$ is given by:

$$K_h = R_{146}/R_{144}$$

where $R_{146}$ is the value of resistor 146, and $R_{144}$ is the value of resistor 144. It is only during the "trim" operation that the external filter is replaced with the single resistor 144 so that the gain can be trimmed at d.c.

Figure 7A:
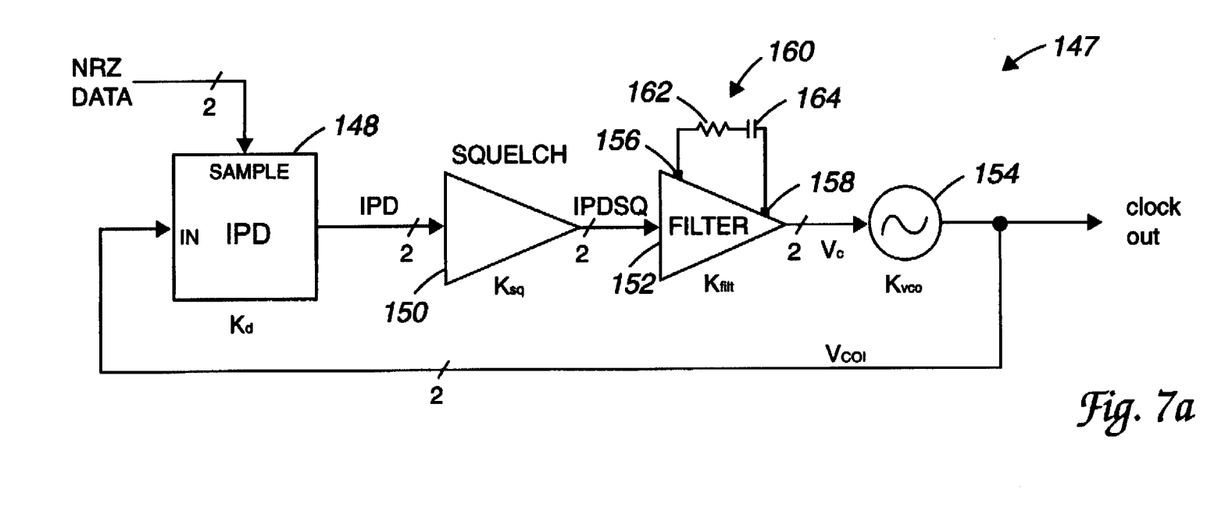
FIGS. 7a, 7b, 8a, and 8b are illustrations used to describe the trimming of the PLL of the present invention.

The method for trimming the filter 34 of the present invention will be described with reference to FIGS. 7a, 7b, 8a, and 8b. In FIG. 7a, a simplified equivalent circuit 147 for the PLL 24 when it is in phase lock, and includes an IPD 148, a squelch 150, a filter 152, and a VCO 154. Attached to pads 156 and 158 is a pole-zero filter 160 including a resistor 162 and a capacitor 164. The gain of each element in the PLL contributes to the overall bandwidth.

More particularly, the gain of IPD 148 can be represented by $K_D$, the gain of squelch 150 can be represented by $K_{SQ}$, the "a.c." gain of filter 152 can be represented by $K_{FILT}$, and the gain of VCO 154 can be represented by $K_{VCO}$. Using feedback theory, it can be shown that the total bandwidth of the equivalent circuit 147 is equal to the product of each of gains, i.e.:

$$\text{Total Loop Bandwidth} = K_D \times K_{SQ} \times K_{FILT} \times K_{VCO}.$$

The units of $K_D$ are volts per radian, the units of $K_{SQ}$ and $K_{FILT}$ are V/V, and the units of $K_{VCO}$ are radians per volt-seconds. The cancellation of these units results in a bandwidth in radians per second.

This equivalent circuit 147 model can be used to trim the filter 34. The methodology is illustrated with reference to FIG. 7b. The feedback loop of FIG. 7a is effectively "broken" by forcing a voltage onto the IPD node. The pole-zero filter 160 is replaced by a simple fixed resistor 166 at pads 156 and 158 which allows the trimming of the squelch 150, filter 152, and the VCO 154. With simultaneous reference to FIGS. 7b and 8a, 0 volts (differential) is forced into the IPD nodes to allow the center frequency of the VCO to be trimmed. The center frequency can be trimmed ("tuned") in a variety of ways, depending upon the VCO architecture. For example, the center frequency can be tuned by trimming the bias currents in the VCO. This will take the center frequency from a first frequency $f_x$ to a desired center frequency $f_c$. In this example, the center frequency is taken as 622 megahertz.

Figure 7B:
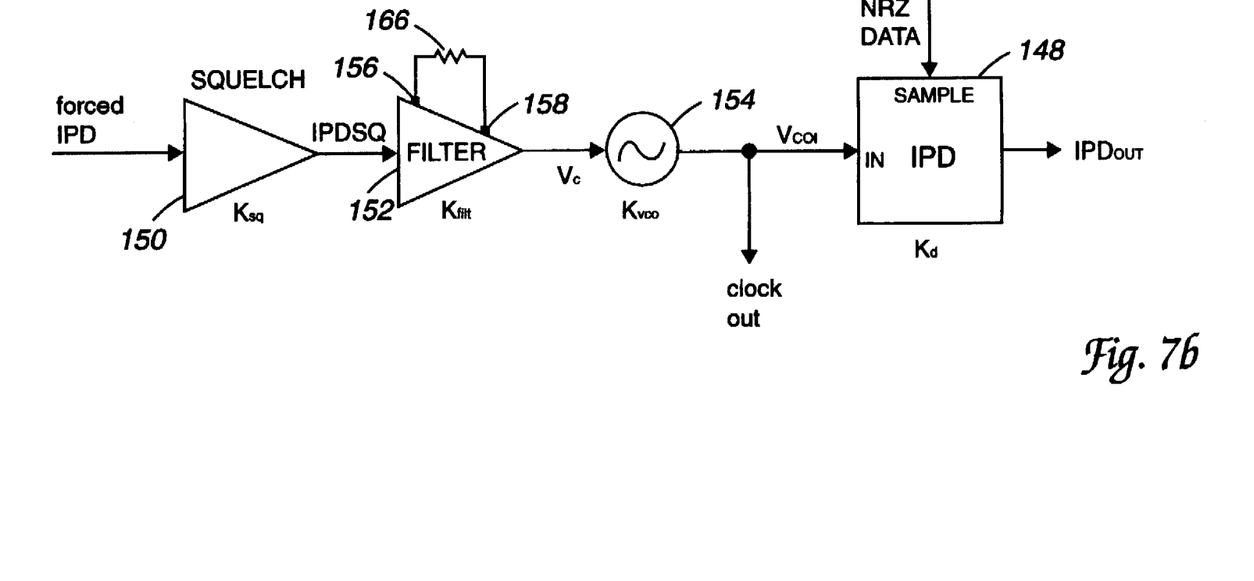
Figure 8A:
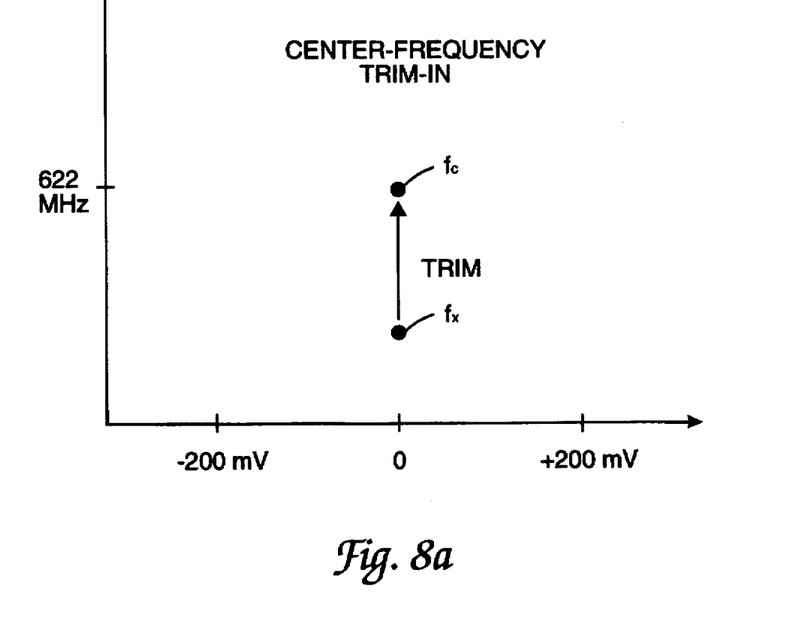
Figure 8B:
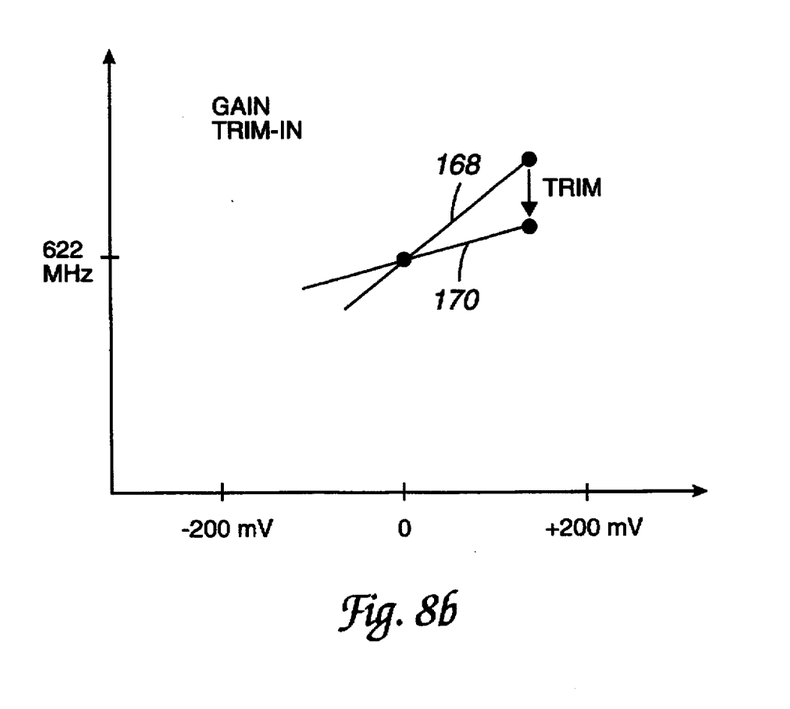

Next, with simultaneous reference to FIGS. 7b and 8b, the signal on IPD is forced to a fixed offset voltage (e.g. 200 millivolts) to create a linear curve as indicated in 168 and then the gain is trimmed with filter resistor 144 to create the linear curve at 170. After this process is completed, the offset is eliminated and the gain is trimmed in three out of the four blocks of FIG. 7b. The phase detector (i.e., IPD 148) can be included in the trim process as well in alternate embodiments of the present invention. From the foregoing, it is clear that the external trim pads permit at least one (and preferably both) of said filter to be trimmed and said voltage controlled oscillator to be tuned.

While this invention has been described in terms of several preferred embodiments, there are alterations, permutations, and equivalents which fall within the scope of this invention. It should also be noted that there are may alternative ways of implementing both the process and apparatus of the present invention. For example, the components values can vary considerably depending upon the design and application, as will be appreciated by those skilled in the art. It is therefore intended that the following appended claims be interpreted as including all such alterations, permutations, and equivalents as fall within the true spirit and scope of the present invention.

What is claimed is:

1. A phase locked loop comprising:
   an in-phase detector having an IPD sample input, an IPD input and an IPD output, said IPD sample input being coupled to a data input;
   a quadrature phase detector having a QPD sample input, a QPD input and a QPD output, said QPD sample input being coupled to said data input;
   a frequency detector having a first FD input coupled to said IPD output, a second FD input coupled to said QPD output, and an FD output;
   a squelch having a squelch input, enable input, and a squelch output, said squelch input being coupled to said IPD output and said squelch enable input being coupled to said FD output;
   a filter having a filter input coupled to said squelch output and a filter output;
   a voltage controlled oscillator having a VCO input coupled to said filter output, a VCO in-phase output, and a VCO quadrature output, said VCO in-phase output being coupled to said IPD input and said VCO quadrature output being coupled to said QPD input.

2. A phase locked loop as recited in claim 1 wherein said frequency detector includes a pair of latches and a dual-state output multiplexer coupled to said pair of latches.

3. A phase locked loop as recited in claim 1 wherein said squelch can attenuate a signal applied to said squelch input by about 50–100%.

4. A phase locked loop as recited in claim 3 wherein said squelch can attenuate a signal applied to said squelch input by about 75%.

5. A phase locked loop as recited in claim 1 wherein said filter is provided with external filter pads to permit at least one of said filter to be trimmed and said voltage controlled oscillator to be tuned.

6. A phase locked loop as recited in claim 5 further comprising the series connection of a capacitor and a resistor across said external filter pads to provide an integration and amplification function by said filter.

7. A phase locked loop comprising:
   in-phase detection means having an IPD sample input and an IPD input and operative to develop an IPD output, said IPD sample input being coupled to a NRZ data input;
   quadrature phase detection means having a QPD sample input and a QPD input and operative to develop a QPD output, said QPD sample input being coupled to said NRZ data input;

frequency detection means having a first FD input coupled to said IPD output and a second FD input coupled to said QPD output, said FD having an FD output;

squelch means having a squelch input and an enable input and operative to develop a squelch output, said squelch input being coupled to said IPD output and said squelch enable input being coupled to said FD output;

filter means having a filter input coupled to said squelch output and operative to develop a filter output;

voltage controlled oscillator means having a VCO input coupled to said filter output and operative to develop a VCO in-phase output and a VCO quadrature output, said VCO in-phase output being coupled to said IPD input and said VCO quadrature output being coupled to said QPD input.

8. A phase locked loop as recited in claim 7 wherein said frequency detection means includes a pair of latch means and a dual-state multiplexer means coupled to said pair of latch means.

9. A phase locked loop as recited in claim 7 wherein said squelch means can attenuate a signal applied to said squelch input by about 50–100%.

10. A phase locked loop as recited in claim 9 wherein said squelch means can attenuate a signal applied to said squelch input by about 75%.

11. A phase locked loop as recited in claim 7 wherein said filter means is provided with external filter pad means to permit at least one of said filter to be trimmed and said voltage controlled oscillator to be tuned.

12. A phase locked loop as recited in claim 11 further comprising the series connection of a capacitor means and a resistor means across said external filter pads to provide an integration and amplification function by said filter means.

13. A method for providing a phase locked signal comprising:
developing an in-phase detection (IPD) output signal from an IPD sample input signal derived from a data input signal and an IPD input signal coupled to a VCO in-phase output;

developing a quadrature phase detection (QPD) output signal from a QPD sample input signal derived from said data input signal and a QPD input signal coupled to a VCO quadrature output;

developing a frequency detection (FD) output signal from said IPD output signal and said QPD output signal;

squelching said IPD output signal in response to said FD output signal to develop a squelch output signal;

filtering said squelch output signal to develop a filter output signal; and developing said VCO in-phase output and said VCO quadrature output in response to said filter output.

14. A method as recited in claim 13 wherein said FD output signal is a dual-state output signal.

15. A method as recited in claim 13 wherein said squelching attenuates said IPD output signal by 50–100% to develop said squelch output signal.

16. A method as recited in claim 13 further comprising the step of adjusting said filtering to provide a trimmed filter function.

17. Method for making an integrated circuit including a phase locked loop comprising the steps of:
producing an integrated circuit die having:
(a) a data input;
(b) an in-phase detector having an IPD sample input coupled to said data input, an IPD input, and an IPD output;
(c) a quadrature phase detector having a QPD sample input coupled to said data input, a QPD input, and a QPD output;
(d) a frequency detector having a first FD input coupled to said IPD output, a second FD input coupled to said QPD output, and an FD output;
(e) a squelch having a squelch input coupled to said IPD output, an enable input coupled to said FD output, and a squelch output;
(f) a filter having a filter input coupled to said squelch output, and a filter output;
(g) a voltage controlled oscillator having a VCO input coupled to said filter output, a VCO in-phase output coupled to said IPD input, and a VCO quadrature output coupled to said QPD input; and packaging said integrated circuit die for use in an electronic circuit.

18. A frequency detector comprising:
a first latch having an IPD input, a QPD input, and a first latch latched signal output;
a second latch having an IPD input, a QPD input, and a second latch latched signal output; and
a dual-state output multiplexer coupled to said first latch latched signal output and said second latch latched signal output, said multiplexer having a FD output which is related to said first latch latched signal output and to said second latch latched signal output to produce a dual-state output signal.

19. A trimmable filter comprising:
a first bipolar transistor formed on a semiconductor substrate having a base coupled to a first input, an emitter coupled to a first voltage node potential by a first current source, and a collector coupled to a second voltage potential node by a second current source;
a second bipolar transistor formed on said semiconductor substrate having a base coupled to a second input, an emitter coupled to said first voltage potential node by a third current source, and a collector coupled to said second voltage potential node by a fourth current source;
said first current source, said second current source, said third current source, and said fourth current source being formed on said semiconductor substrate and being matched current sources;
a variable trim resistor formed on said semiconductor substrate and coupled between one of said emitters and said collectors of said first transistor and said second transistor; and
a pair of leads coupled to the other one of said emitters and said collectors of said first transistor and said second transistor such that an external resistor not formed on said semiconductor substrate can be coupled between the other one of said emitters and collectors.

20. A method for trimming a phase locked loop including a squelch circuit, a filter coupled to an output of the squelch circuit, said filter having a gain adjustment, and a VCO coupled to an output of said filter, said VCO having a center frequency adjustment, said method comprising:
applying an alternating signal to said squelch circuit;
adjusting the center frequency of said filter by monitoring the output of said VCO;
applying an d.c. offset signal to said squelch circuit; and
adjusting the gain of the filter by monitoring the output of said VCO.

* * * * *

UNITED STATES PATENT AND TRADEMARK OFFICE
CERTIFICATE OF CORRECTION

PATENT NO. : 5,694,088
DATED : December 2, 1997
INVENTOR(S) : Dickson

It is certified that error appears in the above-indentified patent and that said Letters Patent is hereby corrected as shown below:

Column 2, line 39, change "Portbacker" to --Pottbacker--

Column 2, line 47, change "Portbacker" to --Pottbacker--

Column 2, line 67, change "fight" to --tight--

Column 5, line 55, change "them" to --there--

Column 6, line 41, change "role" to --rule--

Signed and Sealed this

Tenth Day of March, 1998

BRUCE LEHMAN

*Attest:*

*Attesting Officer*   Commissioner of Patents and Trademarks